(12) United States Patent
Li et al.

(10) Patent No.: US 11,582,859 B2
(45) Date of Patent: Feb. 14, 2023

(54) METHOD FOR MANUFACTURING FLEXIBLE CIRCUIT BOARD

(71) Applicants: HongQiSheng Precision Electronics (QinHuangDao) Co., Ltd., Qinhuangdao (CN); Avary Holding (Shenzhen) Co., Limited., Shenzhen (CN)

(72) Inventors: Bao-Jun Li, Qinhuangdao (CN); Yang Li, Guangdong (CN); Yan-Lu Li, Shenzhen (CN); Li-Kun Liu, Shenzhen (CN)

(73) Assignees: HongQiSheng Precision Electronics (QinHuangDao) Co., Ltd., Qinhuangdao (CN); Avary Holding (Shenzhen) Co., Limited., Shenzhen (CN)

( * ) Notice: Subject to any disclaimer, the term of this patent is extended or adjusted under 35 U.S.C. 154(b) by 0 days.

(21) Appl. No.: 17/467,373

(22) Filed: Sep. 6, 2021

(65) Prior Publication Data
US 2021/0400801 A1    Dec. 23, 2021

Related U.S. Application Data

(63) Continuation of application No. 16/916,067, filed on Jun. 29, 2020, now Pat. No. 11,140,769.

(30) Foreign Application Priority Data

May 27, 2020  (CN) .......................... 202010464183.8

(51) Int. Cl.
*H05K 3/38* (2006.01)
*H05K 1/02* (2006.01)

(52) U.S. Cl.
CPC ........... *H05K 1/0224* (2013.01); *H05K 1/024* (2013.01); *H05K 3/38* (2013.01); *H05K 1/0218* (2013.01);
(Continued)

(58) Field of Classification Search
CPC .......... H05K 3/38; H05K 3/386; H05K 3/387; H05K 3/388
See application file for complete search history.

(56) References Cited

U.S. PATENT DOCUMENTS 6,353,189 B1    3/2002  Shimada et al.
2010/0307798 A1   12/2010  Izadian
(Continued)

FOREIGN PATENT DOCUMENTS

CN    106470523 A    3/2017

*Primary Examiner* — Jeremy C Norris
(74) *Attorney, Agent, or Firm* — ScienBiziP, P.C.

(57) ABSTRACT

A method for manufacturing a flexible circuit board capable of transmitting high frequency signals with reduced attenuation includes providing an inner wiring board including a first conductive wiring layer and a first substrate layer, the first conductive wiring layer including a signal line and two ground lines on both sides of the signal line, the first substrate layer covering a side of the first conductive wiring layer and defining first through holes which expose the signal line; providing two copper clad laminates including a second substrate layer and a copper foil, the second substrate layer having second through hole aligned with the first through holes; laminating the two copper clad laminates onto two sides of the inner wiring board via two adhesive layers, each adhesive layer defining third through holes aligned with the first and second through holes; and forming a second conductive wiring layer from the copper foil.

10 Claims, 7 Drawing Sheets

(52) U.S. Cl.
CPC ......... *H05K 1/0219* (2013.01); *H05K 1/0221* (2013.01); *H05K 1/0222* (2013.01); *H05K 1/0277* (2013.01); *H05K 2201/09063* (2013.01)

(56) References Cited

U.S. PATENT DOCUMENTS

| | | |
|---|---|---|
| 2019/0045630 A1 | 2/2019 | Kim et al. |
| 2019/0088388 A1 | 3/2019 | Baba et al. |

METHOD FOR MANUFACTURING FLEXIBLE CIRCUIT BOARD

CROSS-REFERENCE TO RELATED APPLICATIONS

This is a divisional application of patent application Ser. No. 16/916,067 filed on Jun. 29, 2020, which is based on and claims priority to China Patent Application No. 202010464183.8 filed on May 27, 2020, the contents of which are incorporated by reference herein.

FIELD

The subject matter herein generally relates to circuit boards, in particular to a method for manufacturing a flexible circuit board.

BACKGROUND

In high-frequency electronic signal transmissions, attenuation of the transmission signal is mainly a result of dielectric loss. Dielectric loss is positively correlated with dielectric loss factor and dielectric constant. In order to reduce the transmission loss, a liquid crystal polymer with a low dielectric constant can be used as the substrate layer covering the signal line. However, such material still has a relatively high dielectric loss.

BRIEF DESCRIPTION OF THE DRAWINGS

Implementations of the present technology will now be described, by way of embodiment, with reference to the attached figures.

DETAILED DESCRIPTION

Implementations of the disclosure will now be described, by way of embodiments only, with reference to the drawings. The disclosure is illustrative only, and changes may be made in the detail within the principles of the present disclosure. It will, therefore, be appreciated that the embodiments may be modified within the scope of the claims.

Unless otherwise defined, all technical terms used herein have the same meaning as commonly understood by one of ordinary skill in the art. The technical terms used herein are to provide a thorough understanding of the embodiments described herein, but are not to be considered as limiting the scope of the embodiments.

Figure 1:
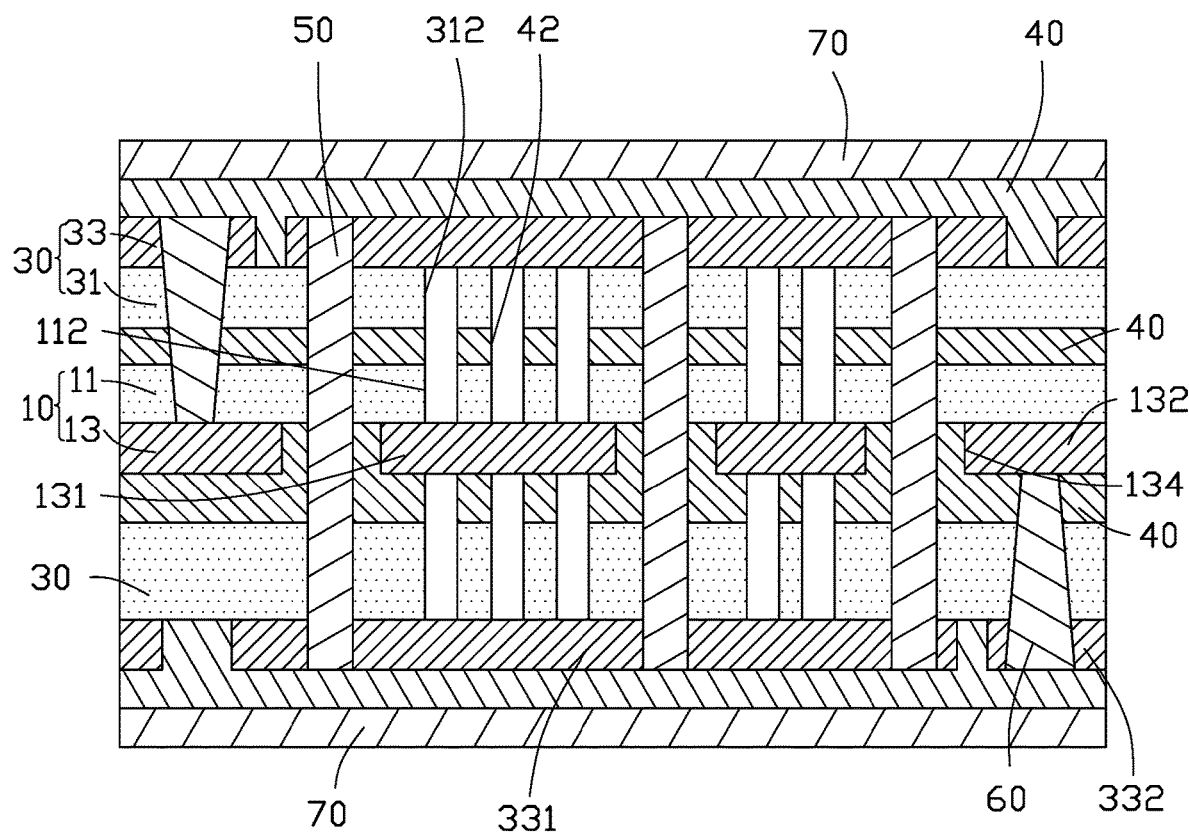
FIG. 1 is a cross-sectional view of an embodiment of a flexible circuit board.

FIG. 1 illustrates a flexible circuit board 100 according to one embodiment. The flexible circuit board 100 includes an inner wiring board 10, and two outer wiring boards 30 disposed on opposite two surfaces of the inner wiring board 10.

The inner wiring board 10 includes a first substrate layer 11 and a first conductive wiring layer 13 disposed on a surface of the first substrate layer 11.

The first conductive wiring layer 13 is made of copper, and includes a signal line 131 and two ground lines 132. The two ground lines 132 are arranged at intervals on both sides of the signal line 131. In the embodiment, the first conductive wiring layer 13 includes two signal lines 131 and two ground lines 132 arranged at intervals on both sides of the two signal lines 131. The first conductive wiring layer 13 has a plurality of slots 134 passing through the first conductive wiring layer 13. One slot 134 isolates the signal lines 131 from each other, and other slots 134 isolate the ground lines 132 from the adjacent signal line 131.

Figure 2:
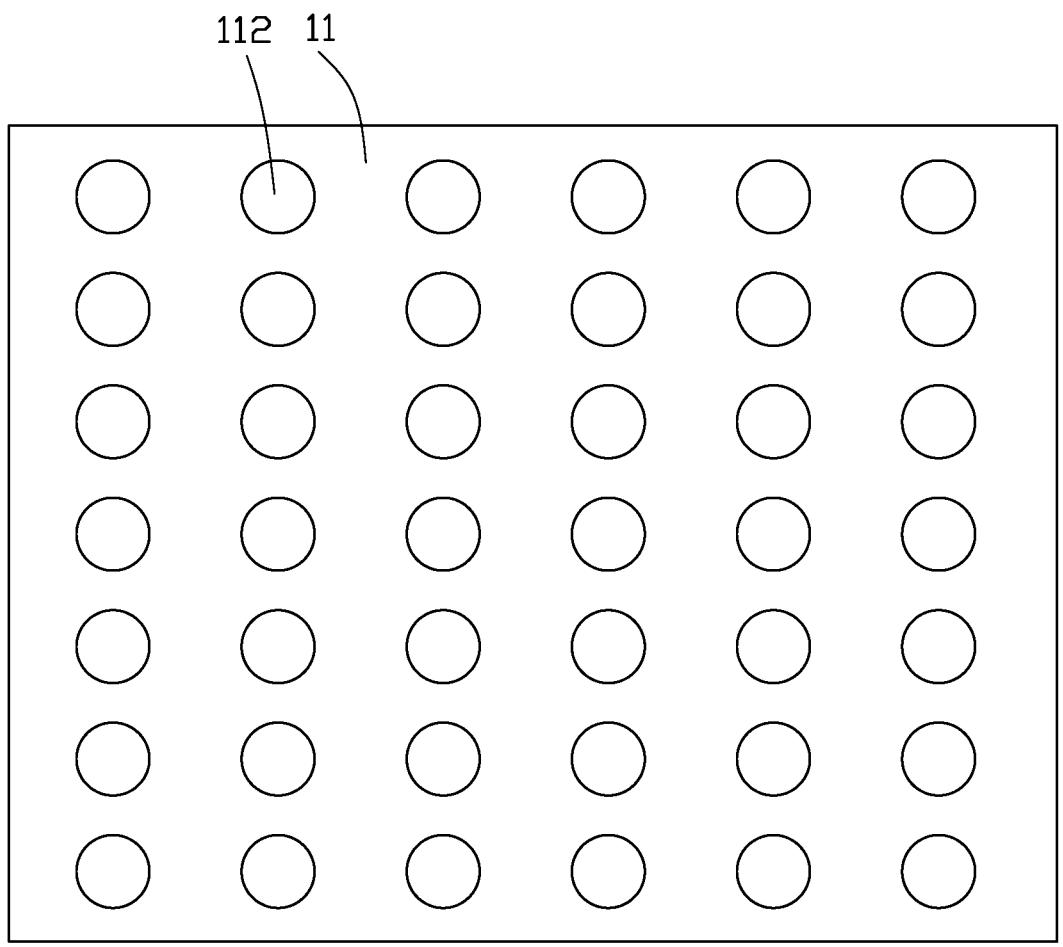
FIG. 2 is a top view of a part of a first substrate layer of the flexible circuit board of FIG. 1.

The first substrate layer 11 covers a surface of the first conductive wiring layer 13. The first substrate layer 11 defines a plurality of first through holes 112 corresponding to the signal lines 131, and the signal lines 131 are exposed from the first through holes 112. Each of the first through holes 112 passes through a first surface and a second surface of the first substrate layer 11, where the first surface abuts the first conductive wiring layer 13, and the second surface is arranged away from the first conductive wiring layer 13. Referring to FIG. 2, the first through holes 112 are arranged in a matrix.

Figure 3:
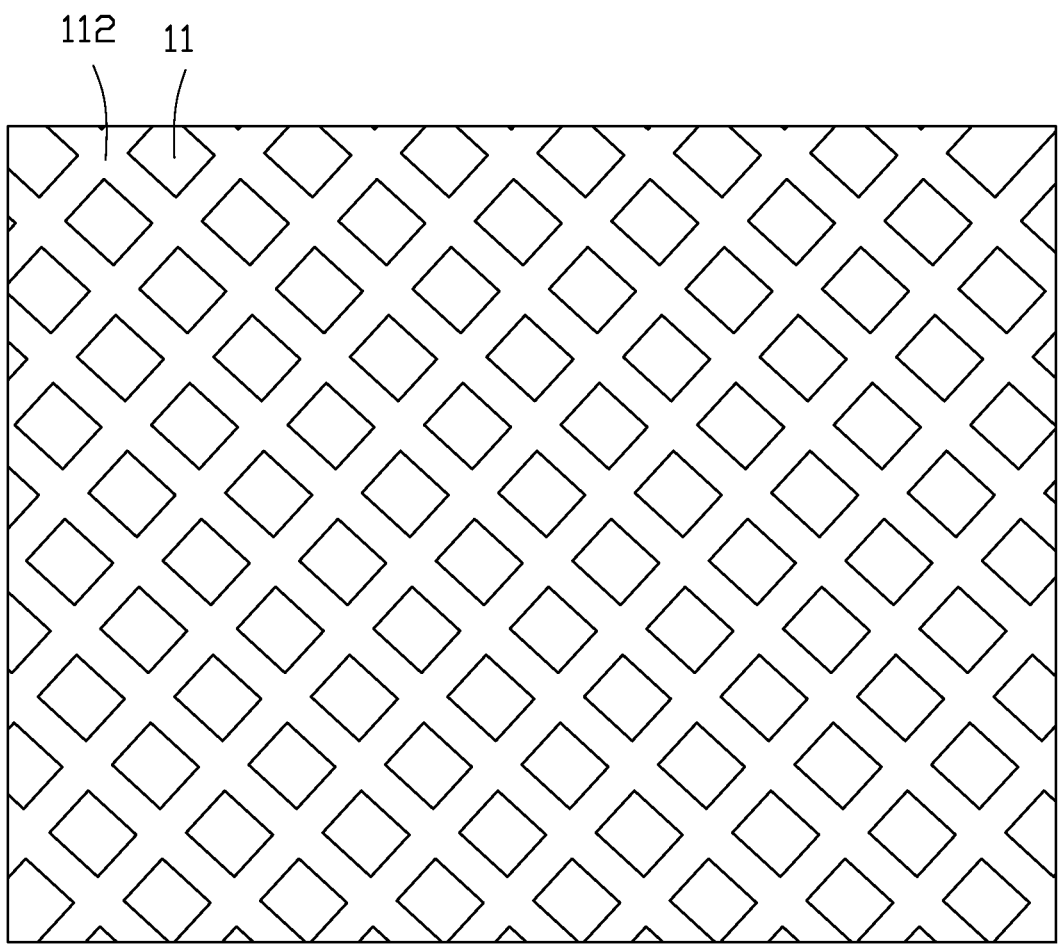
FIG. 3 is a top view of a part of a first substrate layer in another embodiment.

In an alternative embodiment, referring to FIG. 3, each of the first through holes 112 extends to two adjacent lateral surfaces of the first substrate layer 11. The first through holes 112 may be parallel to or intersect each other. In an alternative embodiment, the first through holes 112 may be divided into two groups, the first through holes 112 in each of the two groups are arranged to be parallel to each other, but the two groups intersect each other to form a grid.

The first substrate layer 11 is made of materials for high frequency transmissions, such as liquid crystal polymer, polytetrafluoroethylene, poly-ether-ether-ketone, or polyphenylene oxide. The first substrate layer 11 may also be made of other flexible insulation materials, such as polyimide, polyethylene terephthalate, polyethylene naphthalate, or polyethylene.

The two outer wiring boards 30 are arranged to outer sides of the first substrate layer 11 and the first conductive wiring layer 13. Each of the two outer wiring boards 30 includes a second substrate layer 31 and a second conductive wiring layer 33. The second substrate layer 31 is in contact with the inner wiring board 10, and the second conductive wiring layer 33 covers a surface of the second substrate layer 31 away from the inner wiring board 10.

The second substrate layer 31 has a plurality of second through holes 312, the second through holes 312 communicate one-to-one with the first through holes 112. In the embodiment, each of the second through holes 312 is aligned with one of the first through holes 112. The second through holes 312 may be arranged in a matrix, be parallel to each other, or may intersect each other.

The second substrate layer 31 may be made of materials for high frequency transmissions, such as liquid crystal polymer, polytetrafluoroethylene, poly-ether-ether-ketone, or polyphenylene oxide. The second substrate layer 31 may also be made of other flexible insulation materials, such as polyimide, polyethylene terephthalate, polyethylene naphthalate, or polyethylene.

The second substrate layer 31 and the first substrate layer 11 may be made of the same or different materials. In the embodiment, the second substrate layer 31 and the first substrate layer 11 are both made of liquid crystal polymer.

The second conductive wiring layer 33 is made of copper, and includes a shielding layer 331 and two circuit layers 332. The two circuit layers 332 are arranged at intervals on both sides of the shielding layer 331. The shielding layer 331 is arranged to correspond to the signal line 131, and the two circuit layers 332 are arranged to correspond to the two ground lines 132. The shielding layer 331 is a copper plating layer or a copper foil. The circuit layer 332 is provided with circuit patterns.

In an alternative embodiment, the flexible circuit board 100 further includes two adhesive layers 40. The two adhesive layers 40 attach the two outer wiring boards 30 to the inner wiring board 10. One adhesive layer 40 is sandwiched between the first substrate layer 11 and the second substrate layer 31 of one outer wiring board 30, and the other adhesive layer 40 is sandwiched between the first conductive wiring layer 13 and the second substrate layer 31 of the other outer wiring board 30. The adhesive layer 40 on the first conductive wiring layer 13 infills the slots 134. Each of the two adhesive layers 40 has a plurality of third through holes 42 respectively connecting the first through holes 112 and the second through holes 312. In the embodiment, each of the third through holes 42 is aligned with one of the first through holes 112 and one of the second through holes 312. The third through holes 42 may be arranged in a matrix, be parallel to each other, or may intersect each other.

The flexible circuit board 100 further includes a plurality of first conductive holes 50 and a plurality of second conductive holes 60. The first conductive holes 50 are located on both sides of the signal line 131, and electrically connect the shielding layers 331 of the outer wiring boards 30, to prevent external electromagnetic interference in the signal line 131. Specifically, each of the first conductive holes 50 passes through one of the slots 134, the first substrate layer 11 of the inner wiring board 10, the second substrate layers 31 of the outer wiring boards 30, and the adhesive layers 40, and electrically connects the shielding layers 331 of the outer wiring boards 30. The first conductive holes 50 may be formed of vias passing through the inner wiring board 10, the adhesive layers 40, and the outer wiring boards 30, the vias then being infilled or electroplated with conductive materials.

The second conductive holes 60 electrically connect the ground lines 132 and the circuit layers 332 of the outer wiring boards 30. Specifically, one of the second conductive holes 60 passes through the circuit layer 332 and the second substrate layer 31 of one outer wiring board 30, one adhesive layer 40, and the first substrate layer 11 of the inner wiring board 10, and electrically connects the circuit layer 332 of the one outer wiring board 30 and one of the ground lines 132. The other one of the second conductive holes 60 passes through the other adhesive layer 40 and the circuit layer 332 and the second substrate layer 31 of the other outer wiring board 30, and electrically connects the circuit layer 332 of the other outer wiring board 30 to the other one of the ground lines 132. The second conductive holes 60 may be formed as blind holes on the inner wiring board 10, the adhesive layers 40, and the outer wiring boards 30, the blind holes then being infilled or electroplated with conductive materials.

The flexible circuit board 100 further includes two protective layers 70. The two protective layers 70 are arranged on two outer sides of the two outer wiring boards 30, and configured to protect the second conductive wiring layers 33. In the embodiment, the protective layers 70 are covering layers. In other embodiment, the protective layers 70 may be solder resist layers. The two protective layers 70 may be attached to the outer sides of the two outer wiring boards 30 by two adhesive layers 40.

One embodiment of a method for manufacturing a flexible circuit board includes the following steps of:

S1, providing an inner wiring board including a first substrate layer and a first conductive wiring layer on a surface of the first substrate layer, the first conductive wiring layer including a signal line and two ground lines arranged at intervals on both sides of the signal line, the first substrate layer having a plurality of first through holes corresponding to the signal line;

S2, providing two copper clad laminates, each of the two copper clad laminates including a second substrate layer and a copper foil on a surface of the second substrate layer, the second substrate layer having a plurality of second through holes;

S3, pressing the two copper clad laminates on two sides of the inner wiring board, the second substrate layer abutting the inner wiring board, and the second through holes communicating one-to-one with the first through holes;

S4, forming a second conductive wiring layer from the copper foil to obtain the flexible circuit board.

Figure 4:
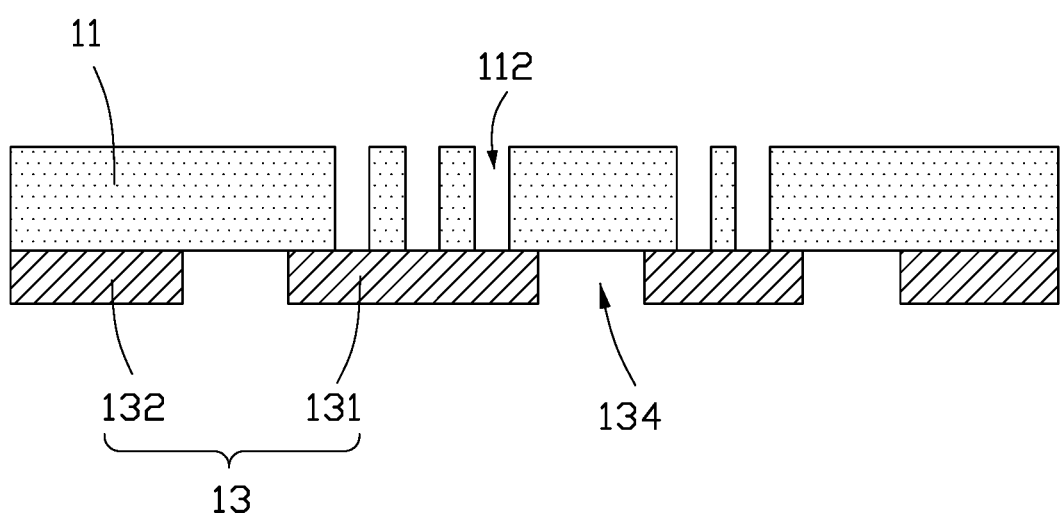
FIG. 4 is a cross-sectional view of an inner wiring board in one embodiment.

Referring to FIG. 4, in step S1, an inner wiring board 10 is provided. The inner wiring board 10 includes a first substrate layer 11 and a first conductive wiring layer 13 disposed on a surface of the first substrate layer 11. The first conductive wiring layer 13 includes a signal line 131 and two ground lines 132 arranged at intervals on both sides of the signal line 131. The first substrate layer 11 defines a plurality of first through holes 112 corresponding to the signal lines 131, the signal lines 131 are exposed from the first through holes 112.

The first conductive wiring layer 13 is made of copper. In the embodiment, the first conductive wiring layer 13 includes two signal lines 131 and two ground lines 132 arranged at intervals on both sides of the two signal lines 131. The first conductive wiring layer 13 has a plurality of slots 134 passing through the first conductive wiring layer 13. One slot 134 isolates the signal lines 131 from each other, and other slots 134 isolate the ground lines 132 from the adjacent signal line 131.

The first substrate layer 11 covers a surface of the first conductive wiring layer 13. Each of the first through holes 112 passes through a first surface and a second surface of the first substrate layer 11, where the first surface abuts the first conductive wiring layer 13, and the second surface is arranged away from the first conductive wiring layer 13.

The first through holes 112 may be arranged in a matrix, be parallel to each other, or may intersect each other. The first through holes 112 may be formed by laser cutting or punching.

The first substrate layer 11 may be made of materials for high frequency transmissions, such as liquid crystal polymer, polytetrafluoroethylene, poly-ether-ether-ketone, or polyphenylene oxide. The first substrate layer 11 may also be made of other flexible insulation materials, such as polyimide, polyethylene terephthalate, polyethylene naphthalate, or polyethylene.

Figure 5:
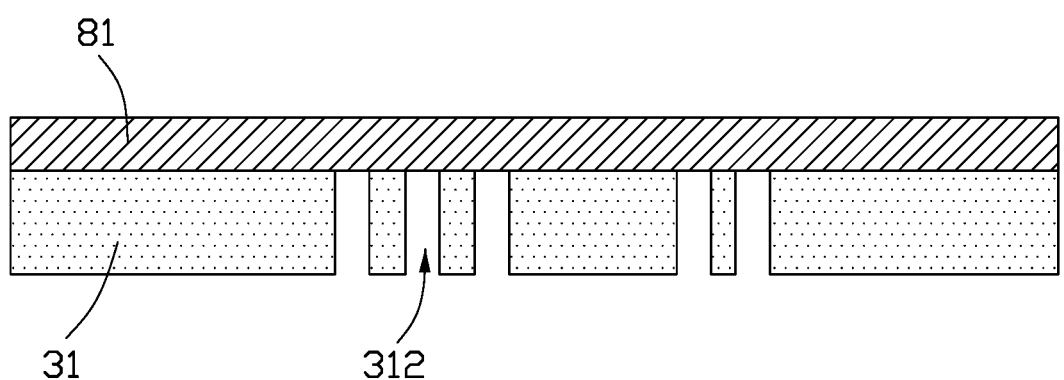
FIG. 5 is a cross-sectional view of a copper clad laminate in one embodiment.

Referring to FIG. 5, in step S2, two copper clad laminates 80 are provided. Each of the two copper clad laminates 80 includes a second substrate layer 31 and a copper foil 81 on a side of the second substrate layer 31. The second substrate layer 31 has a plurality of second through holes 312.

The second through holes 312 may be arranged in a matrix, be parallel to each other, or may intersect each other. The second through holes 312 may be formed by laser cutting or punching.

The second substrate layer 31 may be made of materials for high frequency transmissions, such as liquid crystal polymer, polytetrafluoroethylene, poly-ether-ether-ketone, or polyphenylene oxide. The second substrate layer 31 may also be made of other flexible insulation materials, such as polyimide, polyethylene terephthalate, polyethylene naphthalate, or polyethylene.

The second substrate layer 31 and the first substrate layer 11 may be made of the same or different materials. In the embodiment, the second substrate layer 31 and the first substrate layer 11 are both made of liquid crystal polymer.

Figure 6:
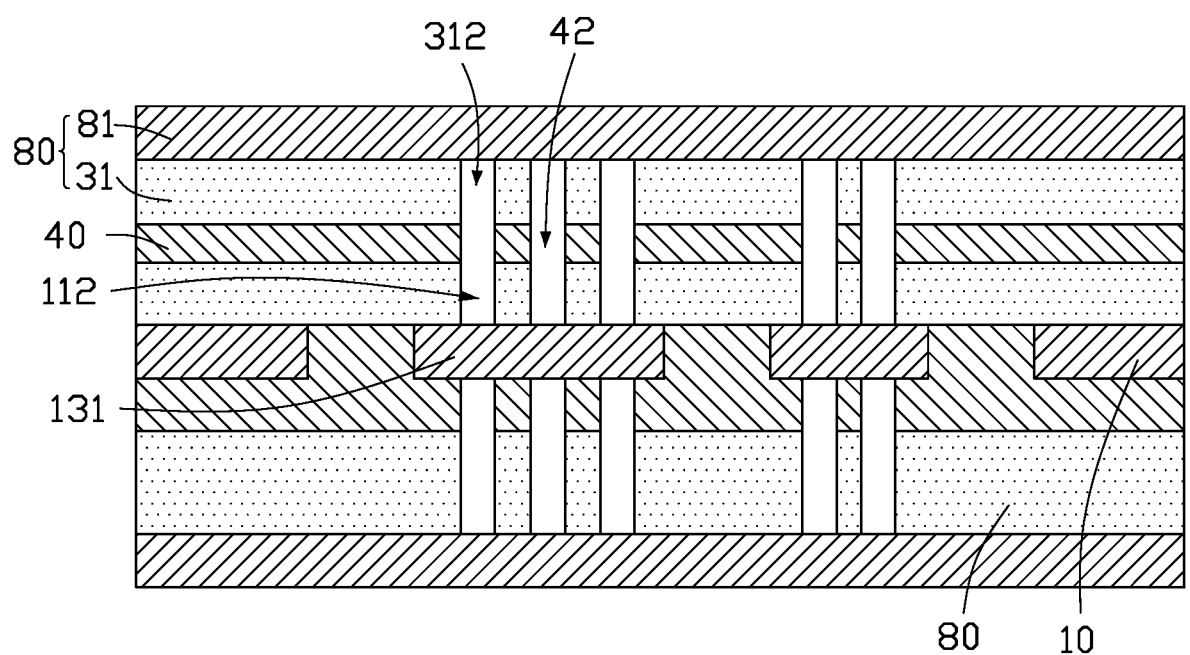
FIG. 6 is a cross-sectional view showing the copper clad laminate of FIG. 5 pressed to each side of the inner wiring board of FIG. 4.

Referring to FIG. 6, in step S3, the two copper clad laminates 80 are pressed on opposite two sides of the inner wiring board 10, the second substrate layer 31 abuts the inner wiring board 10, and the second through holes 312 communicate with the first through holes 112. In the embodiment, each of the second through holes 312 is aligned with one of the first through holes 112.

In an alternative embodiment, the two copper clad laminates 80 are adhered to two sides of the inner wiring board 10 by two adhesive layers 40. One adhesive layer 40 is sandwiched between the first substrate layer 11 and the second substrate layer 31 of one copper clad laminate 80, and another adhesive layer 40 is sandwiched between the first conductive wiring layer 13 and the second substrate layer 31 of the other copper clad laminate 80. The adhesive layer 40 on the first conductive wiring layer 13 infills the slots 134. Each of the two adhesive layers 40 has a plurality of third through holes 42 connecting the first through holes 112 and the second through holes 312. In the embodiment, each of the third through holes 42 is aligned with one of the first through holes 112 and one of the second through holes 312. The third through holes 42 may be arranged in a matrix, be parallel to each other, or may intersect each other.

Figure 7:
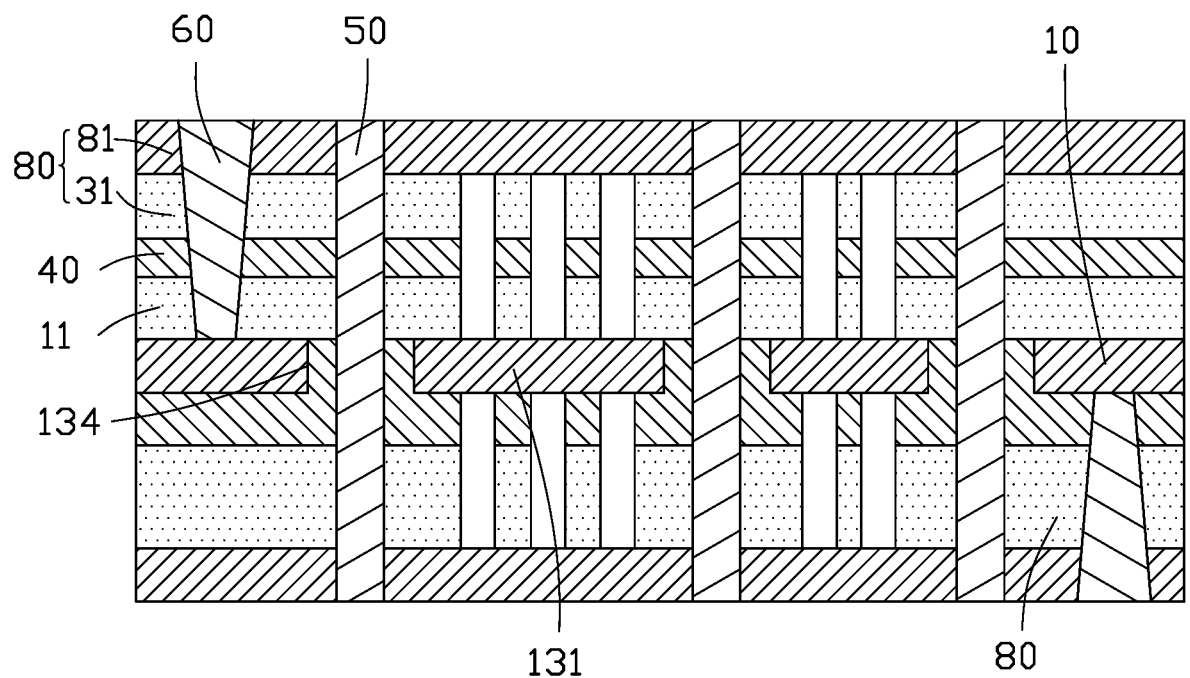
FIG. 7 is a cross-sectional view showing a first conductive hole and a second conductive hole formed on the structure of FIG. 6.

Referring to FIG. 7, after step S3, the method further includes a step of forming a plurality of first conductive holes 50 and a plurality of second conductive holes 60. The first conductive holes 50 are on both sides of the signal line 131 and electrically connect the copper foils 81 of the copper clad laminates 80, the second conductive holes 60 electrically connecting one copper foil 81 and one ground line 132.

Specifically, each of the first conductive holes 50 passes through one of the slots 134, the first substrate layer 11 of the inner wiring board 10, the copper clad laminates 80, and the adhesive layers 40, and electrically connects the copper foils 81. The first conductive holes 50 may be formed of vias passing through the inner wiring board 10, the adhesive layers 40, and the copper clad laminates 80, the vias then being infilled or electroplated with conductive materials.

Specifically, one of the second conductive holes 60 passes through one copper clad laminate 80, one adhesive layer 40, and the first substrate layer 11 of the inner wiring board 10, and electrically connects the one copper clad laminate 80 and one of the ground lines 132. The other one of the second conductive holes 60 passes through the other adhesive layer 40 and the other copper clad laminate 80, and electrically connects the other copper clad laminate 80 and the other one of the ground lines 132. The second conductive holes 60 may be formed from blind holes on the inner wiring board 10, the adhesive layers 40, and the copper clad laminates 80, the blind holes then being infilled or electroplated with conductive materials.

Referring to FIGS. 1 and 7, in step S4, two second conductive wiring layers 33 are formed on the two copper foils 81 to obtain a flexible circuit board 100.

The second conductive wiring layer 33 includes a shielding layer 331 and two circuit layers 332. The two circuit layers 332 are arranged at intervals on both sides of the shielding layer 331. The shielding layer 331 is arranged to correspond to the signal line 131 to prevent external electromagnetic interference affecting the signal line 131. The circuit layers 332 are arranged to correspond to the ground lines 132, and provided with circuit patterns.

Each of the two second conductive wiring layers 33 and one of the second substrate layers 31 constitute an outer wiring board 30.

After forming the two second conductive wiring layers 33, two protective layers 70 are formed on outer sides of the two second conductive wiring layers 33. The protective layers 70 are configured to protect the two second conductive wiring layers 33. In the embodiment, the protective layers 70 are covering layers. In other embodiment, the protective layers 70 may be solder resist layers. Two adhesive layers 40 attach the two protective layers 70 to outer sides of the two outer wiring boards 30.

In the flexible circuit board 100, the first substrate layer 11 of the inner wiring board 10 and the second substrate layers 31 of the outer wiring boards 30 all define through holes corresponding to the signal line 131. The signal line 131 is thus at least partially surrounded by air which has a very low dielectric constant, and attenuation of the signal line 131 during transmission is thereby reduced.

While the present disclosure has been described with reference to particular embodiments, the description is illustrative of the disclosure and is not to be construed as limiting the disclosure. Therefore, those of ordinary skill in the art can make various modifications to the embodiments without departing from the scope of the disclosure as defined by the appended claims.

What is claimed is:

1. A method for manufacturing a flexible circuit board comprising:
   providing an inner wiring board comprising a first substrate layer and a first conductive wiring layer on a side of the first substrate layer, the first conductive wiring layer comprising a signal line and two ground lines arranged at intervals on both sides of the signal line, the first substrate layer having a plurality of first through holes corresponding to the signal line;
   providing two copper clad laminates, each of the two copper clad laminates comprising a second substrate layer and a copper foil on a side of the second substrate layer, the second substrate layer having a plurality of second through holes aligned one-to-one with the plurality of first through holes;
   laminating the two copper clad laminates onto two sides of the inner wiring board via two adhesive layers, wherein the two adhesive layers attaches the two copper clad laminates to the inner wiring board, one adhesive layer is sandwiched between the first substrate layer and the second substrate layer of one outer wiring board, the other adhesive layer is sandwiched between the first conductive wiring layer and the second substrate layer of the other outer wiring board, each of the two adhesive layers defines a plurality of third through holes each aligned with a corresponding one of the plurality of first through holes and a corresponding one of the plurality of second through holes; and forming a second conductive wiring layer from the copper foil to obtain two outer wiring boards, thus to obtain the flexible circuit board.

2. The method of claim 1, further comprising forming a plurality of first conductive holes and a plurality of second conductive holes, wherein the first conductive wiring layer defines a plurality of slots isolating the signal line from the two ground lines, each of the plurality of first conductive holes passes through one of the plurality of slots and is electrically connected to the second conductive wiring layer of each of the two outer wiring boards, and each of the plurality of second conductive holes electrically connects one of the two ground lines and the second conductive wiring layer.

3. The method of claim 2, wherein the second conductive wiring layer comprises a shielding layer and two circuit layers arranged at intervals on both sides of the shielding layer, the shielding layer is arranged to correspond to the signal line, each of the plurality of first conductive holes is electrically connected to the shielding layer of the second conductive wiring layer of each of the two outer wiring boards, and each of the plurality of second conductive holes is electrically connected to a corresponding circuit layer.

4. The method of claim 3, wherein the shielding layer is a copper plating layer or a copper foil.

5. The method of claim 2, wherein forming a plurality of first conductive holes comprises: forming a plurality of vias passing through the inner wiring board, the two adhesive layers, and the two outer wiring boards, infilling or electroplating the plurality of vias with conductive materials.

6. The method of claim 1, further comprising: forming a protective layer on an outer side of the second conductive wiring layer.

7. The method of claim 1, wherein each of the plurality of first through holes passes through a first surface of the first substrate layer adjacent to the first conductive wiring layer and a second surface of the first substrate layer away from the first conductive wiring layer, the plurality of first through holes are arranged in a matrix.

8. The method of claim 1, wherein each of the plurality of first through holes extends to two adjacent lateral surfaces of the first substrate layer, the plurality of first through holes are parallel to or intersect each other.

9. The method of claim 1, wherein a material of the first substrate layer comprises one or more of liquid crystal polymer, polytetrafluoroethylene, poly-ether-ether-ketone, and polyphenylene oxide.

10. The method of claim 1, wherein a material of the second substrate layer comprises one or more of liquid crystal polymer, polytetrafluoroethylene, poly-ether-ether-ketone, and polyphenylene oxide.

* * * * *